(12) United States Patent
Chaoui

(10) Patent No.: US 7,852,155 B2
(45) Date of Patent: Dec. 14, 2010

(54) CLASS-D AMPLIFIER AND METHOD THEREFOR

(75) Inventor: Hassan Chaoui, Toulouse (FR)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 69 days.

(21) Appl. No.: 11/572,431

(22) PCT Filed: Mar. 3, 2006

(86) PCT No.: PCT/US2006/007791

§ 371 (c)(1),
(2), (4) Date: Oct. 31, 2008

(87) PCT Pub. No.: WO2007/100334

PCT Pub. Date: Sep. 7, 2007

(65) Prior Publication Data

US 2009/0184765 A1 Jul. 23, 2009

(51) Int. Cl.
*H03F 3/217* (2006.01)

(52) U.S. Cl. .................................................... 330/251
(58) Field of Classification Search .................. 330/10, 330/207 A, 251
See application file for complete search history.

(56) References Cited

U.S. PATENT DOCUMENTS 3,517,300 A * 6/1970 McMurray .................. 363/25
4,894,621 A * 1/1990 Koenig et al. ............... 330/251
7,279,973 B1 * 10/2007 Sevenhans et al. .......... 330/251
7,382,188 B2 * 6/2008 Talty .......................... 330/251

FOREIGN PATENT DOCUMENTS

WO    WO2005002043 A2    1/2005

* cited by examiner

*Primary Examiner*—Steven J Mottola
(74) *Attorney, Agent, or Firm*—Robert F. Hightower

(57) ABSTRACT

In one embodiment, a class-D amplifier (11) is configured to form first (DP) and second (DN) PWM signals each having a duty cycle that is proportional to a received analog input signal (12) and responsively to enable a switch (31, 32) to short the outputs (13, 14) of the class-D amplifier (11) together responsively to some states of the first (DP) and second (DN) PWM signals.

17 Claims, 3 Drawing Sheets

CLASS-D AMPLIFIER AND METHOD THEREFOR

BACKGROUND OF THE INVENTION

The present invention relates, in general, to electronics, and more particularly, to methods of forming semiconductor devices and structures.

In the past, the semiconductor industry utilized various methods and structures to produce class-D amplifiers. The prior class-D amplifiers had various applications such as audio power amplifiers for cellular phones. In such applications, the class-D amplifier converted an analog signal to a digital signal and used the digital signal to switch a load with digital switches. One example of such a class-D amplifier was disclosed in U.S. Pat. No. 6,211,728 issued to Chen et al on Apr. 3, 2001. One disadvantage of these prior class-D amplifiers was electromagnetic interference (EMI) caused by the switching of the amplifier. The electromagnetic interference often interfered with the operation of other electronic elements.

Accordingly, it is desirable to have a class-D amplifier that has reduced electromagnetic interference.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
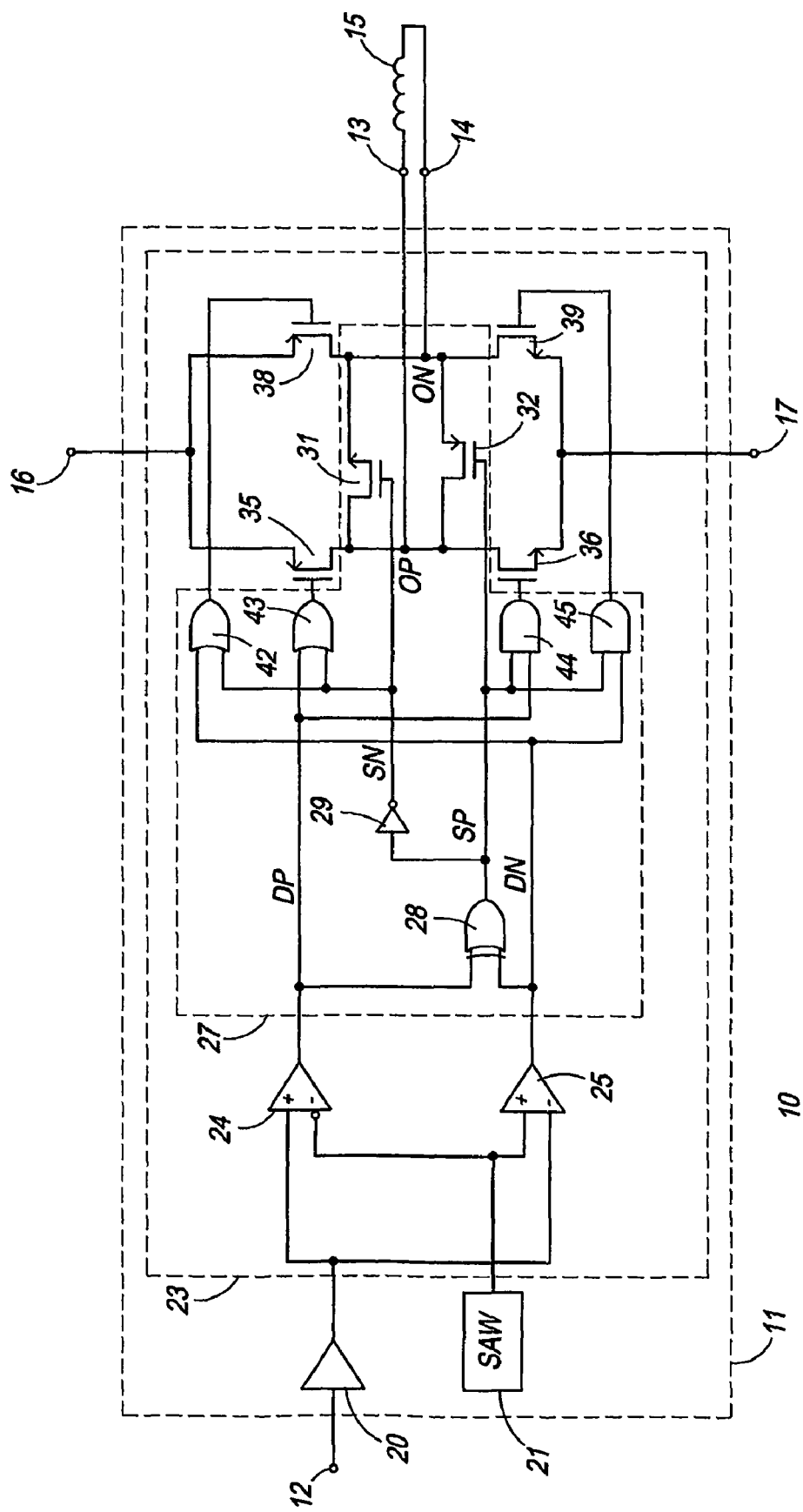
FIG. 1 schematically illustrates an embodiment of a portion of an audio system that includes an exemplary embodiment of a class-D amplifier in accordance with the present invention.

FIG. 1 schematically illustrates an embodiment of a portion of an audio system 10 that includes an exemplary embodiment of a class-D amplifier 11. Amplifier 11 is configured to receive an analog input signal on a signal input 12 and responsively form output signals to differentially drive a load 15. For the exemplary embodiment of system 10 illustrated in FIG. 1, load 15 is illustrated as an inductor of an audio speaker and will be explained as such hereinafter. However, those skilled in the art will appreciate that amplifier 11 may be used for other applications and that load 15 may be another type of load, such as motors or audio displays used in cellular phones, instead of an audio speaker. Those skilled in the art will also appreciate that load 15 may have other impedance components, not shown, in addition to the inductor. Amplifier 11 is connected to receive an input voltage for operating amplifier 11 between a voltage input 16 and a voltage return 17. Input 16 generally is connected to a voltage supply, such as a battery, and return 17 is connected to a common return such as a common ground. Amplifier 11 forms a first output signal or positive output signal (OP) on a first output 13 and forms a second output signal or negative output signal (ON) on a second output 14. Signals OP and ON are configured to drive load 15. Amplifier 11 generally includes an analog amplifier 20, and a driver circuit 23. Analog amplifier 20 generally receives the analog input signal from a source external to amplifier 11. For example, the analog input signal may be an audio signal from a cellular phone or from a laptop computer. Amplifier 20 amplifies the analog input signal, filters the analog input signal with a filter such as a low pass filter (not shown), and produces an analog signal on the output of amplifier 20. Driver circuit 23 usually includes a control circuit 27, an H-Bridge driver or H-bridge, and a pulse width modulated (PWM) circuit that converts the analog signal from amplifier 20 to a first pulse width modulated (PWM) signal or positive PWM signal (DP) and a second PWM signal or negative PWM signal (DN). The PWM circuit typically includes a sawtooth signal generator or saw 21, a first comparator 24 and a second comparator 25 that are configured to receive the analog signal from amplifier 20, receive the sawtooth signal from saw 21, and form the respective DP and DN signals. Circuit 23 utilizes the two PWM signals (DP and DN) to control the H-Bridge. The H-bridge includes two pair of series connected switches. The first pair of series connected switches is configured in a totem pole configuration, such as illustrated by a first transistor 35 and a second transistor 36. A common connection between the two switches forms the OP signal and is connected to output 13. The second pair of series connected switches are also configured in a totem pole configuration, such as illustrated by a third transistor 38 and a fourth transistor 39. The second pair of series connected switches also has a common connection between the two switches that forms the ON signal and is connected to output 14. The H-bridge is connected between input 16 and return 17 in order to connect load 15 to receive current from the input voltage and conduct the current to return 17. Control circuit 27 includes an exclusive OR (XOR) gate 28, an inverter 29, OR gates 42 and 43, AND gates 44 and 45, and a shorting switch that is connected between the two common connections of the H-Bridge. For the exemplary embodiment illustrated in FIG. 1, the shorting switch is implemented as two parallel transistors 31 and 32. The two transistors are used for the switch to ensure bi-directional current flow between the two common points of the H-Bridge. Control circuit 27 forms a positive switch signal (SP) and a negative switch signal (SN) that are used to control the switch of respective transistors 32 and 31. As will be seen further hereinafter, control circuit 27 is operably coupled to inhibit supplying current to or sinking current from outputs 13 and 14 and also holds outputs 13 and 14 at a voltage value that is greater than the voltage on return 17 and lower than the voltage input 16. In the preferred embodiment, the voltage on outputs 13 and 14 is held to the average voltage of inputs 16 and 17.

Figure 2:
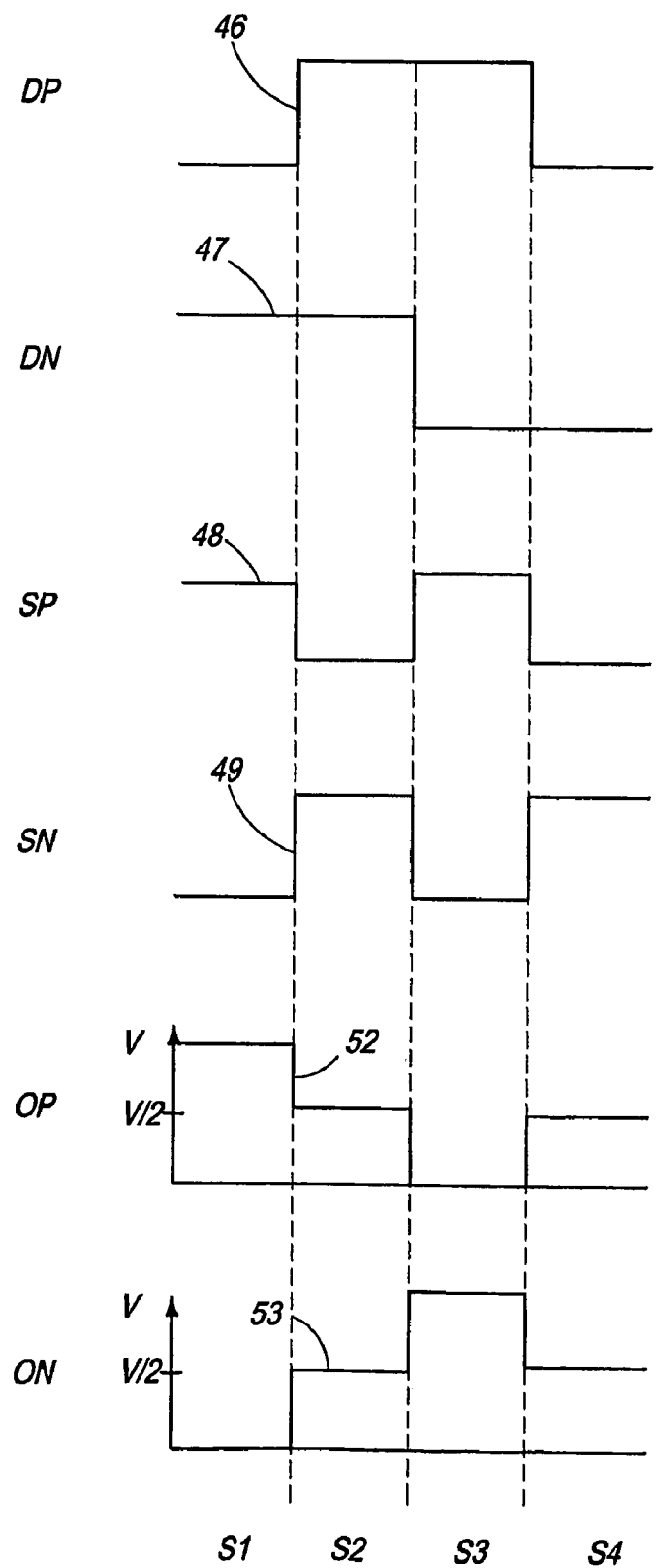
FIG. 2 is a graph having plots of some signals of the amplifier of FIG. 1 in accordance with the present invention.

FIG. 2 is a graph having plots of some of the signals of circuit 23. The ordinate indicates increasing value of the illustrated signal and the abscissa illustrates four different states of signals DP and DN. Because there are two PWM signals used to control the H-Bridge, there are only four possible states of transistors 31, 32, 35, 36, 38, and 39 (except for some dead-time that may be used to avoid cross conduction in the totem pole configuration used for the H-bridge). FIG. 2 illustrates these four possible states of DP and DN and corresponding states for some other signals of circuit 23. A plot 46 graphically illustrates the positive PWM signal (DP) from comparator 24 and a plot 47 graphically illustrates the negative PWM signal (DN) from comparator 25. A plot 48 illustrates positive switch signal SP from circuit 27 and a plot 49 illustrates negative switch signal SN from circuit 27. A plot 52 illustrates the output signal OP on output 13 and a plot 53 illustrates the output signal ON on output 14. This explanation has references to FIG. 1 and FIG. 2.

In the preferred embodiment, saw 21 is configured to form a sawtooth waveform having a fixed frequency. Comparators 24 and 25 compare the analog signal from amplifier 20 to the sawtooth waveform from saw 21 and generate the respective positive (DP) and negative (DN) PWM signals. Consequently, comparator 24 forms DP and comparator 25 forms DN with both signals having a fixed frequency. The period of the DP and DN signals is the period of the sawtooth waveform signal from saw 21. Thus, each signal DP and DN has a duty cycle that is derived form the amplitude of the analog input signal on input 12 by the comparison between the analog signal and the sawtooth waveform. The difference between the duty cycle of signals DP and DN is proportional to the amplitude of the analog signal from amplifier 20, thus, proportional to the amplitude of the analog input signal received on input 12. The difference between the duty cycle of signals DP and DN is the amount of the period of the signals that either DP or DN is asserted and the other signal is negated. For example, if the output of amplifier 20 is approximately at the midpoint of the output range, such as at the value of the common mode voltage of amplifier 20 (equivalent to the analog input signal on input 12 having a value of zero), the duty cycle of DP and DN typically is approximately equal, thus, the difference of the duty cycles is approximately zero. As the value of the analog signal on the output of amplifier 20 decreases, the duty cycle of DP decreases and the duty cycle of DN increases. The opposite occurs for increases in the amplitude of the analog signal on the output of amplifier 20. For example, at the beginning of a period that is initiated by the SAW signal, both DP and DN may be asserted. As the SAW signal increases, DN may become negated and later DP may become negated. The portion of the period that DP is asserted and DN is not asserted represents the difference between the duty cycles. Saw 21 generally has a frequency that is much higher than the highest frequency of the input signal received on input 12. Consequently, the PWM signals from comparators 24 and 25 sample the input signal at a high rate in order to accurately represent the analog input signal.

For a first state of DP and DN, identified as S1 in FIG. 2, of the four possible states of signals DP and DN, the output of comparator 24 is low and the output of comparator 25 is high which enables transistors 35 and 39 and disables transistors 36 and 38. Because only one input of gate 28 is high, the output of gate 28 is high which forces the output of inverter 29 low thereby disabling the switch of transistors 31 and 32. The output of gates 43 and 44 are low and the output of gates 42 and 45 are high. Consequently, transistors 35 and 39 are enabled to supply current to drive load 15 and transistors 36 and 38 are disabled. Transistor 35 pulls output 13 to the voltage of input 16 and transistor 39 pulls output 14 to the voltage of return 17, as illustrated by plots 52 and 53, thereby differentially driving load 15. Transistors 35 and 39 also charge the parasitic capacitance of transistors 35, 36, 38, and 39 in addition to the capacitance from wiring and other capacitances that are parasitically attached to outputs 13 and 14. Transistor 35 charges the capacitance on output 13 to the voltage of input 16 and transistor 39 charges the capacitance on output 14 to the voltage of return 17. In state two (S2), the output of comparators 24 and 25 are both high. Because both inputs of gate 28 are high, the output of gate 28 is low and the output of inverter 29 is high which enables the switch of transistors 31 and 32 to short the two common nodes of the H-bridge together and prevent circuit 23 from supplying current to load 15. The output of gates 44 and 45 are low and the output of gates 42 and 43 are high which disables transistors 35, 36, 38 and 39. Enabling transistors 31 and 32 also causes the capacitance on outputs 13 and 14 to divide the charge between the capacitances. As a result, outputs 13 and 14 both are charged to a value of approximately one-half of the voltage of between input 16 and return 17 (see plots 52 and 53 at S2). In the third state, identified as S3 in FIG. 2, the output of comparator 24 is high and the output of comparator 25 is low. Because only one input of gate 28 is high, the output of gate 28 is high and the output of inverter 29 is low which disables the switch of transistors 31 and 32. The output of gates 43 and 44 are high and gates 42 and 45 are low which enables transistors 36 and 38 and disables transistors 35 and 39. Transistor 38 pulls output 14 to the voltage of input 16 and transistor 36 pulls output 13 to the voltage of return 17 thereby supplying current to load 15 to differentially drive load 15. Transistor 38 charges the parasitic capacitance on output 14 to the value of the voltage on input 16 and transistor 36 charges the parasitic capacitance on output 13 to the value of the voltage on return 17. In the fourth state, S4, the output of both comparators 24 and 25 are low. The low from comparators 24 and 25 forces the output of gate 28 low and the output of inverter 29 high. The low from gate 28 and the high from inverter 29 enable the switch of respective transistors 32 and 31. The output of gates 44-45 are low and the output of gates 42 and 43 are high which disables transistors 35, 36, 38, and 39. Enabling transistors 31 and 32 shorts the common connection of the H-bridge together. Thus, it can be seen that when the digital signals DP and DN are in a common or the same state, transistors 31 and 32 short outputs 13 and 14 together. Enabling transistors 31 and 32 also causes the capacitance on outputs 13 and 14 to divide the charge between the capacitances. As a result, outputs 13 and 14 both are charged to a value of approximately one-half of the voltage of between input 16 and return 17 (see plots 52 and 53 at S4). As can be seen from plots 52 and 53, when the outputs change state to drive load 15, the voltage swing of each output is a maximum of one-half of the voltage between input 16 and return 17 as expressed by:

$$\text{Swing}=(V16-V17)/2$$

where
V16−V17=the difference between the voltage values on input 16 and return 17.

Since the EMI generated by the switching of signal OP and ON is proportional to the square of the voltage swing as given by:

$$\text{EMI}=kV^2$$

where
V=the voltage swing of the signal, and
k=proportionality constant.

Then the EMI generated by signals OP and ON is approximately one-fourth the EMI generated by prior class-D amplifiers that have a voltage swing that is approximately equal to the voltage supplied to the class-D amplifier as shown below:

$$EMI(11) = k((V16 - V17)/2)^2$$
$$= k(1/4)(V16 - V17)^2.$$

In order to assist in providing this functionality for amplifier 11 and circuit 23, a source of transistor 35 is commonly connected to a source of transistor 38 and to input 16. A drain of transistor 35 is commonly connected to output 13, a drain of transistor 36, a drain of transistor 32, and a drain of transistor 31. A drain of transistor 38 is commonly connected to output 14, a drain of transistor 39, a source of transistor 32, and a source of transistor 31. A source of transistor 36 is commonly connected to a source of transistor 39 and to return 17. A gate of transistor 35 is connected to an output of gate 43. A first input of gate 43 is commonly connected to the output of comparator 24, a first input of gate 44, and a first input of gate 28. A second input of gate 43 is commonly connected to the output of inverter 29, the gate of transistor 31, and a first input of gate 42. A second input of gate 42 is commonly connected to the output of comparator 25, a first input of gate 45, and a second input of gate 28. The output of gate 42 is connected to a gate of transistor 38. A second input of gate 44 is commonly connected to the output of gate 28, the input of inverter 29, a second input of gate 45, and a gate of transistor 32. The output of gate 44 is connected to a gate of transistor 36. The output of gate 45 is connected to a gate of transistor 39. A non-inverting input of comparator 24 is commonly connected to an inverting input of comparator 25 and to the output of amplifier 20. An inverting input of comparator 24 is commonly connected to a non-inverting input of comparator 25 and the output of saw 21. The input of amplifier 20 is connected to input 12.

Figure 3:
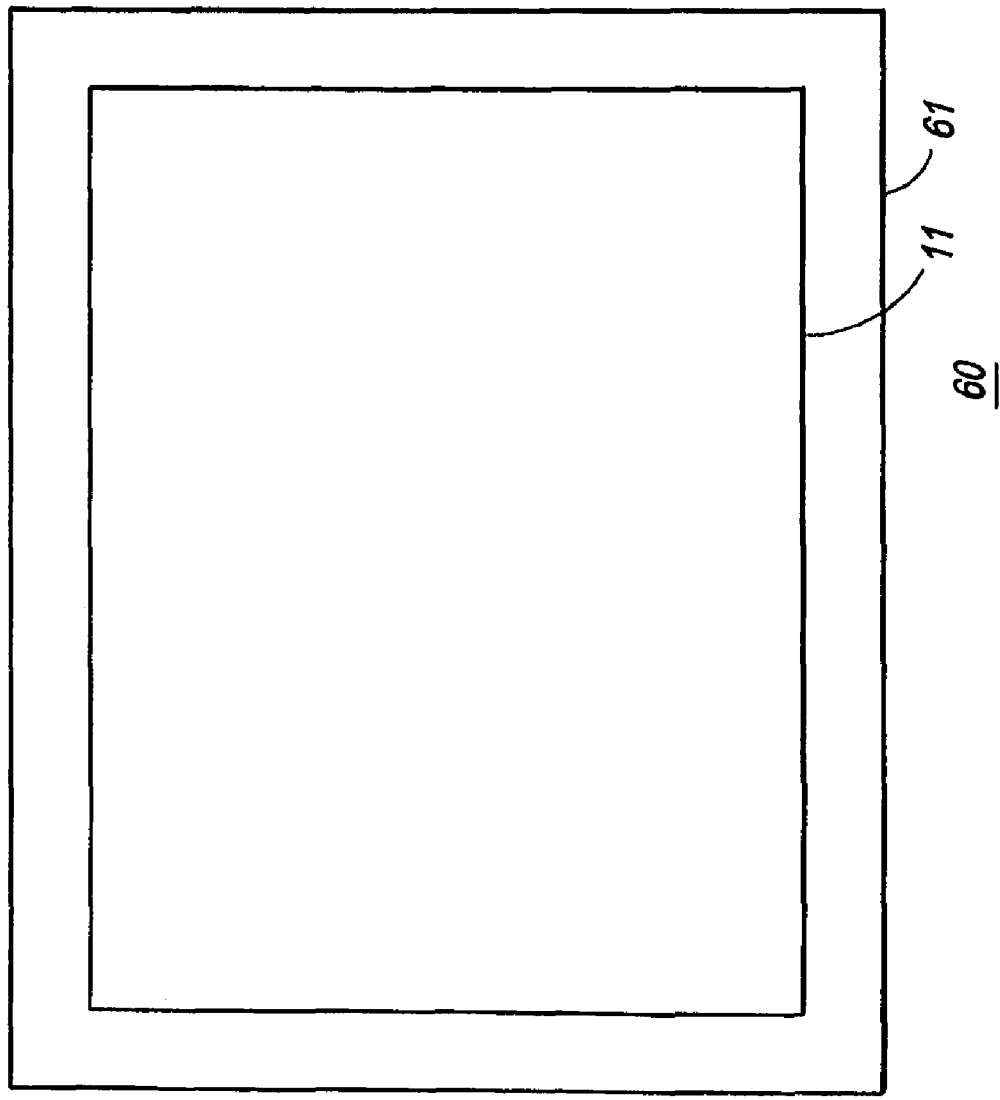
FIG. 3 schematically illustrates an enlarged plan view of a semiconductor device that includes at least a portion of the amplifier of FIG. 1 in accordance with the present invention.

FIG. 3 schematically illustrates an enlarged plan view of a portion of an embodiment of a semiconductor device or integrated circuit 60 that is formed on a semiconductor die 61. Amplifier 11 is formed on die 61. Die 61 may also include other circuits that are not shown in FIG. 3 for simplicity of the drawing. Amplifier 11 and device or integrated circuit 60 are formed on die 61 by semiconductor manufacturing techniques that are well known to those skilled in the art.

In view of all of the above, it is evident that a novel device and method is disclosed. Included, among other features, is configuring the amplifier to form first and second PWM switching signals and to enable a switch to short the outputs together responsively to some states of the PWM signals. Shorting the outputs together assists in reducing the EMI generated by the switching of the load.

While the subject matter of the invention is described with specific preferred embodiments, it is evident that many alternatives and variations will be apparent to those skilled in the semiconductor arts. For example, other switch circuits may be used to inhibit circuit 27 from driving the load. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A class-D amplifier comprising:
a first switch and a second switch coupled as a first pair of stacked switches having a first output at a common node between the first switch and the second switch;
a third switch and a fourth switch coupled as a second pair of stacked switches having a second output at a common node between the third switch and the fourth switch; and
a control circuit operably coupled to short only the first output to the second output, the control circuit including a fifth switch coupled between the first output of the first pair of stacked switches and the second output of the second pair of stacked switches wherein the control circuit is configured to operate the fifth switch to short the first output to the second output, the control circuit configured to receive an input signal and responsively form a first pulse width modulated signal having a first duty cycle that is determined by an amplitude of the input signal and also responsively form a second pulse width modulated signal having a second duty cycle that is determined by an amplitude of the input signal wherein a difference between the first duty cycle and the second duty cycle is proportional to an amplitude of the input signal.

2. The class-D amplifier of claim 1 further including the control circuit configured to use the first pulse width modulated signal and the second pulse width modulated signal to inhibit the class-D amplifier from supplying current to the output of the class-D amplifier.

3. The class-D amplifier of claim 1 wherein the class-D amplifier is configured to supply current to the output of the class-D amplifier responsively to a difference between the first duty cycle and the second duty cycle.

4. The class-D amplifier of claim 1 wherein the first pulse width modulated signal and the second pulse width modulated signal have a fixed frequency.

5. A class-D amplifier comprising:
a first switch and a second switch coupled as a first pair of stacked switches having a first output at a common node between the first switch and the second switch;
a third switch and a fourth switch coupled as a second pair of stacked switches having a second output at a common node between the third switch and the fourth switch;
a control circuit operably coupled to short only the first output to the second output, the control circuit including a fifth switch coupled between the first output of the first pair of stacked switches and the second output of the second pair of stacked switches wherein the control circuit is configured to operate the fifth switch to short the first output to the second output; and
a sixth switch coupled between the first output of the first pair of stacked switches and the second output of the second pair of stacked switches wherein the control circuit is configured to operate the sixth switch to short the first output to the second output.

6. A class-D amplifier comprising:
a first switch and a second switch coupled as a first pair of stacked switches having a first output at a common node between the first switch and the second switch;
a third switch and a fourth switch coupled as a second pair of stacked switches having a second output at a common node between the third switch and the fourth switch; and
a control circuit operably coupled to short only the first output to the second output, the control circuit including a fifth switch coupled between the first output of the first pair of stacked switches and the second output of the second pair of stacked switches wherein the control circuit is configured to operate the fifth switch to short the first output to the second output, the control circuit operably coupled to hold a voltage on outputs of the class-D amplifier to a value that is approximately at a mid-point between a value of a voltage return of the class-D amplifier and a value of an operating voltage of the class-D amplifier.

7. The class-D amplifier of claim 6 wherein the control circuit is operably coupled to disable the first pair of stacked switches and the second pair of stacked switches to inhibit the class-D amplifier from supplying current to the outputs of the class-D amplifier.

8. A method of forming a class-D amplifier comprising:
operably coupling the class-D amplifier to form digital signals responsively to an analog input signal;
configuring the class-D amplifier to supply current to outputs of the class-D amplifier responsively to the digital signals; and
configuring a control circuit of the class-D amplifier to inhibit the class-D amplifier from supplying current to the outputs responsively to a state of the digital signals representing a non-zero value of the analog input signal and hold a voltage on the outputs of the class-D amplifier to a voltage that is approximately at a mid-point between a voltage return of the class-D amplifier and an operating voltage of the class-D amplifier.

9. The method of claim 8 wherein operably coupling the class-D amplifier to form digital signals responsively to the analog input signal includes configuring the class-D amplifier to form a first PWM signal having a first duty cycle that is derived from an amplitude of the analog input signal and a second PWM signal having a second duty cycle that is derived from the amplitude of the analog input signal wherein a difference between the first duty cycle and the second duty cycle is proportional to the amplitude of the analog input signal.

10. The method of claim 9 wherein configuring the control circuit of the class-D amplifier to inhibit the class-D amplifier from supplying current to the outputs responsively to the state of the digital signals includes configuring the control circuit of the class-D amplifier to inhibit the class-D amplifier from supplying current to the outputs responsively to the first PWM signal and the second PWM signal.

11. The method of claim 8 wherein configuring the control circuit of the class-D amplifier to inhibit the class-D amplifier from supplying current to the outputs includes configuring the control circuit to couple the outputs together.

12. The method of claim 11 wherein configuring the control circuit to couple the outputs together includes configuring the control circuit to couple the outputs together when the digital signals are in a common state.

13. The method of claim 8 wherein configuring the control circuit of the class-D amplifier to inhibit the class-D amplifier from supplying current to the outputs includes operably coupling the control circuit to inhibit supplying current to the outputs when the digital signals are in a common state.

14. A class-D amplifier comprising:
a first circuit operably coupled to receive an analog signal and responsively form digital signals representative of the analog signal;
an H-bridge circuit having first and second outputs, the H-bridge circuit operably coupled to supply current to the outputs and sink current from the outputs responsively to the digital signals;
a first switch coupled in parallel between the first and second outputs of the H-bridge circuit; and
a second switch coupled in parallel with the first switch.

15. The class-D amplifier of claim 14 further including control logic configured to form first and second control signals from the digital signals wherein the first control signal enables the first switch for common states of the digital signals and the second control signal enables the second switch for common states of the digital signals.

16. The class-D amplifier of claim 14 wherein the first switch is operability coupled to inhibit the class-D amplifier from supplying current to the outputs responsively to the digital signals.

17. The class-D amplifier of claim 14 further including control logic configured to form a control signal from the digital signals wherein the control signal enables the first switch for common states of the digital signals.

* * * * *